(12) United States Patent
Kurosawa

(10) Patent No.: US 7,964,955 B2
(45) Date of Patent: Jun. 21, 2011

(54) ELECTRONIC DEVICE PACKAGE AND ELECTRONIC EQUIPMENT

(75) Inventor: Hirofumi Kurosawa, Tatsuno-machi (JP)

(73) Assignee: Seiko Epson Corporation (JP)

( * ) Notice: Subject to any disclaimer, the term of this patent is extended or adjusted under 35 U.S.C. 154(b) by 1233 days.

(21) Appl. No.: 11/262,998

(22) Filed: Oct. 31, 2005

(65) Prior Publication Data
US 2006/0103000 A1 May 18, 2006

(30) Foreign Application Priority Data

Nov. 16, 2004 (JP) .................................. 2004-331962

(51) Int. Cl.
  H01L 23/48 (2006.01)
  G02F 1/1345 (2006.01)
(52) U.S. Cl. .................. 257/690; 349/149; 349/151
(58) Field of Classification Search .................. 349/149, 349/152, 151; 257/690, 774
  See application file for complete search history.

(56) References Cited

U.S. PATENT DOCUMENTS

| 5,909,055 | A | 6/1999 | Yamashita et al. |
| 6,479,901 | B1 * | 11/2002 | Yamada .................. 257/774 |
| 6,693,359 | B1 * | 2/2004 | Lin ........................ 257/774 |
| 7,064,421 | B2 | 6/2006 | Chiu et al. |
| 2004/0173892 | A1 * | 9/2004 | Nakanishi ............. 257/690 |
| 2004/0188499 | A1 | 9/2004 | Nosaka |

FOREIGN PATENT DOCUMENTS

| JP | 11-297246 | 10/1999 |
| JP | 2000-068694 | 3/2000 |
| JP | 2000-216330 | 8/2000 |
| JP | 2004-221257 | 8/2004 |
| JP | 2004-281539 | 10/2004 |
| JP | 2006-135216 | 5/2006 |
| TW | 222733 | 12/1992 |

* cited by examiner

Primary Examiner — Nathanael R Briggs
(74) Attorney, Agent, or Firm — Harness, Dickey & Pierce, P.L.C.

(57) ABSTRACT

This electronic device package includes a substrate upon which an electronic device is mounted, a plurality of device electrodes which are formed upon an electronic device, a plurality of substrate electrodes which are formed upon the substrate, and a plurality of connection lines, formed by a liquid drop ejection method, each of which electrically connects together one of the plurality of device electrodes and one of the plurality of substrate electrodes. The plurality of substrate electrodes are arranged in a staggered configuration.

7 Claims, 9 Drawing Sheets

ELECTRONIC DEVICE PACKAGE AND ELECTRONIC EQUIPMENT

BACKGROUND OF THE INVENTION

1. Field of the Invention

The present invention relates to an electronic device package, and to an electronic equipment.

Priority is claimed on Japanese Patent Application No. 2004-331962, filed Nov. 16, 2004, the content of which is incorporated herein by reference.

2. Description of Related Art

From the past, as a technique for mounting an electronic device such as a semiconductor chip (an IC chip) or the like upon a substrate, in order electrically to connect together a terminal electrode on one surface of the electronic device (a device electrode) and a wiring pattern upon the substrate, the so called wire bonding technique has been widely used (for example, refer to Japanese Unexamined Patent Application, First Publication No. 2004-221257).

Apart from this technique, as a technique related to the above described electrical connection, there is a technique in which an electrically conductive member is sandwiched between the terminals which are to be the object of connection (for example, refer to Japanese Unexamined Patent Application, First Publication No. 2000-216330). Furthermore, as a technique directed to the same objective, there is a technique in which a member which includes anisotropic electrically conductive particles (an anisotropic electrically conductive film (ACF) or an anisotropic electrically conductive paste (ACP)) is placed between electrodes which are arranged so as to confront one another (for example, refer to Japanese Unexamined Patent Application, First Publication No. 2000-068694).

Yet further, in relation to the above described electrical connection, a technique has been proposed which utilizes a liquid drop ejection method (for example, refer to Japanese Unexamined Patent Application, First Publication No. 2004-281539). In this technique, an electrically conductive material is placed upon the substrate in liquid drop form, and the connecting wiring is formed by hardening this material.

This technique for forming connecting wiring using the above described liquid drop ejection method possesses the beneficial aspect that the stress which is imposed upon the electronic device during the process of wiring formation is comparatively small. Moreover, with the above described technique, it is easy to plan for reduction of the pitch (i.e., miniaturization) of the wiring, since it is possible to arrange the material with high accuracy.

However, even if the pitch of the terminal electrodes upon the electronic device is narrowed down, it often happens that the pitch of the wiring upon the substrate (the substrate electrode) cannot correspond thereto. In other words, due to various limitations, there is a tendency for the lower limit value for the array pitch of the electrodes upon the substrate to be large, as compared with that for the electrodes upon the electronic device. This fact can easily lead to increase of the size of the wiring region upon the substrate, due to the requirements for extending the wiring and the like, and this can constitute a hindrance to making the substrate more compact.

SUMMARY OF THE INVENTION

The present invention has been conceived in the light of the above described circumstances, and it takes as its primary objective to provide an electronic device package which can correspond to a narrow pitch for the device electrodes, and which moreover can be made more compact than heretofore; and, furthermore, the present invention takes as another of its objectives to provide an electronic equipment which incorporates such an electronic device package.

The electronic device package of the present invention includes: a substrate upon which electronic device is mounted; a plurality of device electrodes which are formed upon the electronic device; a plurality of substrate electrodes which are formed upon the substrate; and a plurality of connection lines, formed by a liquid drop ejection method, each of which electrically connects together one of the plurality of device electrodes and one of the plurality of substrate electrodes; wherein the plurality of substrate electrodes are arranged in a staggered configuration.

Here, the plurality of substrate electrodes may be arranged upon the substrate within substantially the same plane, or may be arranged upon the substrate as being divided between a plurality of surfaces which are not coplanar.

With the above described electronic device package, due to the above described arrangement of the substrate electrodes in a staggered manner, the gap between neighboring ones of these substrate electrodes is comparatively wide. Due to this, it is possible to make the array pitch of the substrate electrodes to correspond to the array pitch of the device electrodes. By making the array pitch of the substrate electrodes substantially the same as the array pitch of the device electrodes, it is possible to alleviate the sinuosity of the wiring, and it is possible to anticipate reduction of the size of the wiring region upon the substrate.

In other words, with this electronic device package, it is possible to narrow down the pitch of the device electrodes, as is desired, and moreover to make the entire device more compact.

With the above described electronic device package, there may be further included a sloping member which includes a sloping face portion between the plurality of device electrodes and the plurality of substrate electrodes; and the length of the sloping face portion of the sloping member may be varied according to the distance between each one of the plurality of device electrodes and its corresponding one of the plurality of substrate electrodes.

In this case, for example, the overall shape of the sloping member may be a comb shape.

According to this structure, by the provision of the sloping member, even though there is a step between the device electrodes and the substrate electrodes, it is still possible reliably to form the above described connection lines by using a liquid drop ejection method. In other words, with the liquid drop ejection method, it is comparatively difficult to lay down material upon a substantially vertical surface of a body. However, by providing the sloping member so as to cover the substantially vertical surface of the body that is constituted by the above described step, and by laying down the material for formation of the connection lines upon a sloping face portion of this sloping member, it is possible to perform wiring formation in a simple and easy manner by using a liquid drop ejection method.

Furthermore, by making the length of the sloping face portion of the sloping member to vary according to the distance between each one of the plurality of device electrodes and its corresponding one of the plurality of substrate electrodes, it is possible to form the above described connection lines in a reliable manner using a liquid drop ejection method, even for the plurality of substrate electrodes which are arranged in a staggered manner.

Another electronic device package according to the present invention includes a substrate upon which an electronic device is mounted; a plurality of device electrodes which are formed upon the electronic device; a plurality of substrate electrodes which are formed upon the substrate; and a plurality of connection lines, formed by a liquid drop ejection method, each of which electrically connects together one of the plurality of device electrodes and one of the plurality of substrate electrodes; wherein the plurality of substrate electrodes are arranged upon the substrate as being divided between a plurality of surfaces which are not coplanar.

With the above described electronic device package, by arranging the plurality of substrate electrodes upon the substrate as being divided between a plurality of surfaces which are not coplanar, the gap between each neighboring pair of the substrate electrodes is comparatively wide. Due to this, it is possible to make the array pitch of the substrate electrodes correspond to the array pitch of the device electrodes. By making the array pitch of the substrate electrodes be substantially equal to the array pitch of the device electrodes, it is possible to alleviate the sinuosity of the wiring, and it is possible to anticipate reduction in the size of the wiring region upon the substrate.

In other words, with this electronic device package, it is possible to narrow down the pitch of the device electrodes, as is desired, and moreover to make the entire device more compact.

With the above described electronic device package, for example, the plurality of surfaces may include a mounting surface of the substrate upon which the electronic device is mounted, and its rear surface.

In this case, the substrate may be provided with through holes for passing the connection lines through from its the mounting surface to its the rear surface, and the substrate electrodes upon the rear surface of the substrate may be arranged so as to block up the openings of the through holes at the rear surface side.

According to this structure, even though the region for formation of the wiring includes these substantially vertical surfaces upon the body (the sides of the through holes), the openings of the through holes at the rear surface side of the through holes in the substrate are blocked up by the substrate electrodes. Due to this, it is possible to form the above described connection lines using a liquid drop ejection method in a simple and reliable manner, by laying down the material for formation of the connection lines so as to block up these through holes.

The electronic equipment of the present invention is provided with an electronic device package as described above.

It is possible to anticipate reduction of size and weight of this electronic device, due to its electronic device package having been made more compact.

DETAILED DESCRIPTION OF THE INVENTION

In the following, preferred embodiments of the present invention will be described with reference to the drawings.

Figure 1:
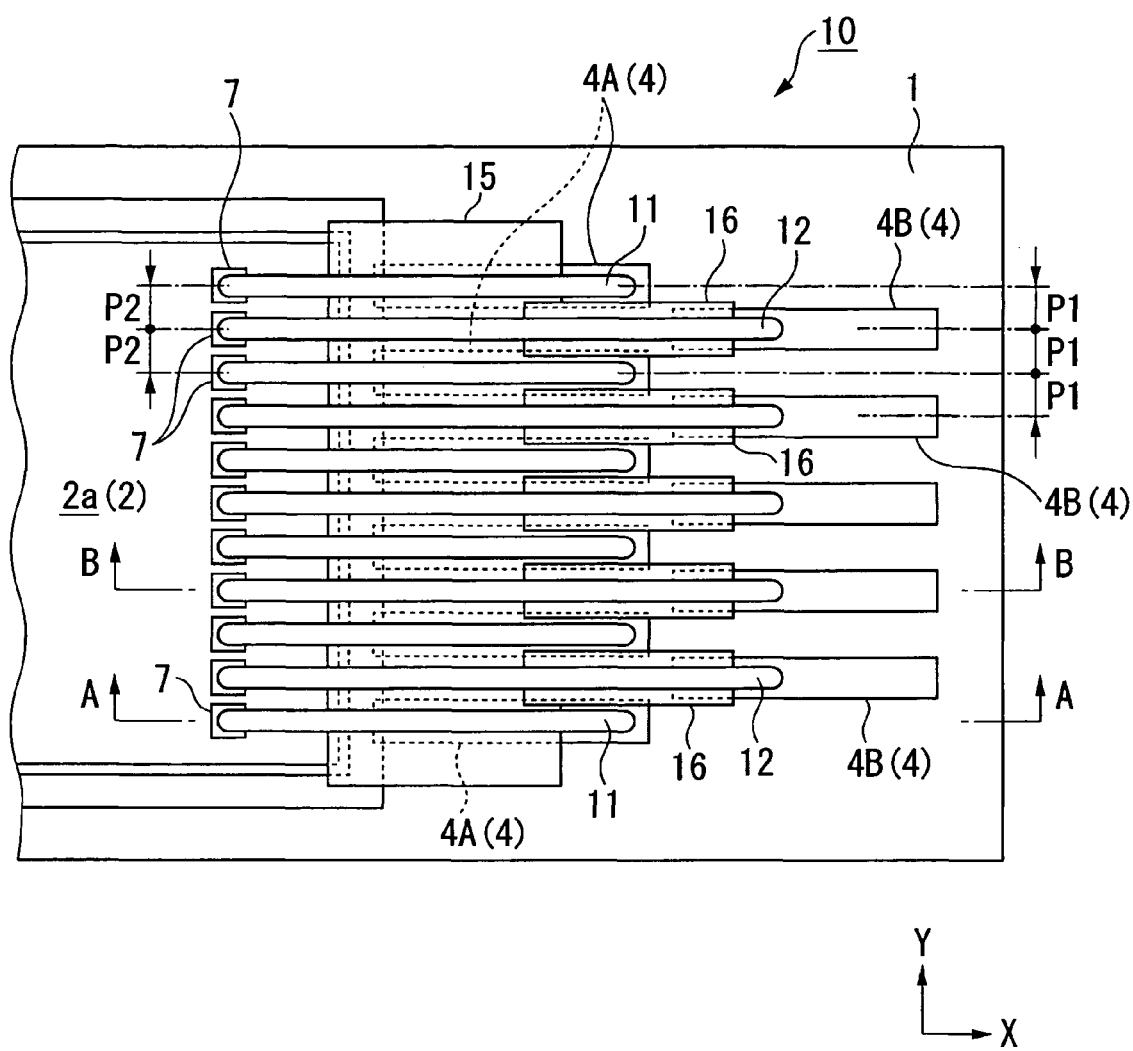
FIG. 1 is a partial plan view showing a preferred embodiment of the electronic device package according to the present invention.

FIG. 1 is a partial plan view showing a preferred embodiment of the electronic device package according to the present invention.

As shown in FIG. 1, in this electronic device package 10, a chip component (an electronic device) 2 is face-up bonded upon a substrate 1, and it has a structure in which electrodes 7 of the chip component 2 (device electrodes 7), and electrodes 4 of the substrate 1 (substrate electrodes 4) are electrically connected together.

The substrate 1 is a multi-layer or single layer wiring substrate upon which a wiring pattern is formed, and its main body may be rigid or may be flexible. In this wiring pattern, there are formed a plurality of electrode terminals (the substrate electrodes 4). This plurality of substrate electrodes 4, apart from being formed by a plating method or a stud method or the like, may also be formed by employing a liquid drop ejection method.

In this example, each of the plurality of substrate electrodes 4 is formed, in plan view, in a roughly rectangular shape. The longitudinal direction (the X direction) of each of these substrate electrodes 4 in plan view is the direction in which it is separated from its device electrode 7, while its transverse direction (its Y direction) is the direction which is orthogonal to the above described direction of separation.

Furthermore, this plurality of substrate electrodes 4 are arranged in a staggered configuration. In other words, the plurality of substrate electrodes 4 are arranged at a predetermined pitch (P1) at substantially equal intervals in the Y direction (the transverse direction of each of the electrodes 4), and, along this Y direction, they are alternated at two different positions along the X direction. To put it in another manner, the plurality of substrate electrodes 4 may be subdivided into two electrode groups, a first group of substrate electrodes 4A and a second group of substrate electrodes 4B, each of which is arranged at a pitch (2×P1) in the Y direction, and which are mutually separated from one another in the X direction; and these groups of substrate electrodes 4A and 4B are displaced relatively to one another at a predetermined pitch (P1) in the Y direction.

A widely used electronic component which includes external connection terminals upon its one side surface may be used as the chip component 2. In other words, the chip component 2 may be an active component such as a semiconductor component or the like which is not provided with any integrated circuitry, or may be a passive component such as a resistor, a capacitor, an inductance, or the like.

A plurality of electrode terminals (device electrodes 7) are formed as an array upon the terminal surface 2a of the chip component 2. These device electrodes 7 may be, for example, formed by plating Ni and Au in that order upon a base layers (not shown in the figures) consisting of aluminum alloy which are extended from an integrated circuit (not shown in the figures) within the chip component 2. In these device electrodes 7, for the outermost layer (the topmost layer) which constitutes the effective joining layer, apart from Au, it would also be acceptable to use, for example, Ag, Cu, Sn, or In; and, furthermore, it would also be acceptable to employ a structure including a lamination of a plurality of these materials.

The electrodes 7 of the chip component 2 and the electrodes 4 of the substrate 1 are electrically connected together via a plurality of connection lines 11 and 12. Here, among this plurality of connection lines 11 and 12, the one end of each of the connection lines 11 is connected to one of the electrodes 4 of the chip component 2, while its other end is connected to one of the substrate electrodes 4A of the substrate 1. On the other hand, the one end of each of the connection lines 12 is connected to one of the electrodes 4 of the chip component 2, while its other end is connected to one of the substrate electrodes 4B of the substrate 1. In this example, these connection lines 11 and 12 are manufactured using a liquid drop ejection method.

In other words, each of the connection lines 11 and 12 is manufactured by laying down wiring material in liquid drop form in a linear region between one of the device electrodes 7 and one of the substrate electrodes 4A, 4B, and by hardening this wiring material. A sloping member 15 and a plurality of sloping members 16 are disposed at the edge of the chip component 2. The connection lines 11 and 12 are formed on the sloping surfaces of these sloping members 15 and 16. Due to the existence of these sloping members 15 and 16, it is possible to implement wiring formation reliably by using a liquid drop ejection method, even though the structure includes steps between the device electrodes 7 and the substrate electrodes 4A and 4B. In this example, in correspondence to the staggered array arrangement of the plurality of substrate electrodes 4, the plurality of connection spots between the connection lines 11 and 12 and the substrate electrodes 4A and 4B are also arranged as a staggered array.

Figure 2:
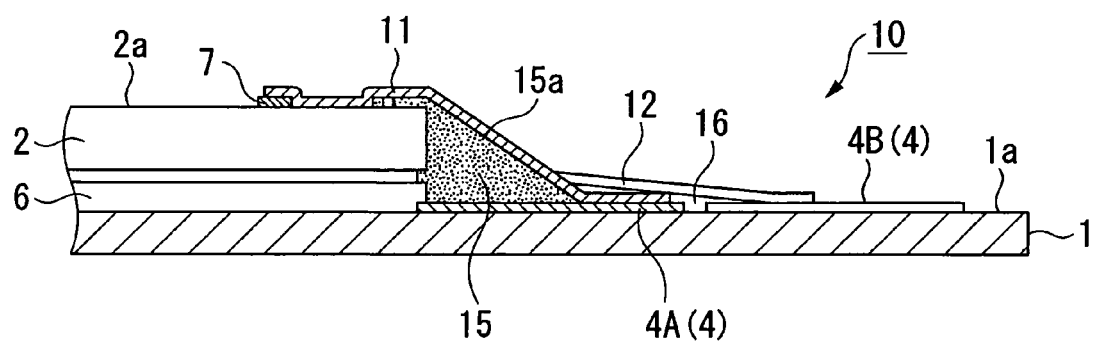
FIG. 2 is a sectional view of this preferred embodiment of the electronic device package, taken in a plane shown by the arrows A-A in FIG. 1.
Figure 3:
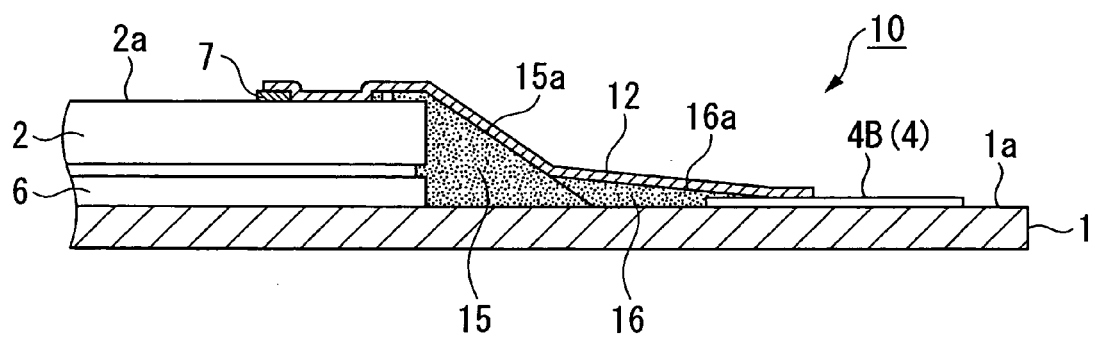
FIG. 3 is another sectional view of this preferred embodiment of the electronic device package, taken in a plane shown by the arrows B-B in FIG. 1.

FIG. 2 is a sectional view of this electronic device package taken in a plane shown by the arrows A-A in FIG. 1, and FIG. 3 is another sectional view thereof, taken in a plane shown by the arrows B-B in FIG. 1.

As shown in FIGS. 2 and 3, the chip component 2 is mounted upon the substrate 1 via an adhesive layer 6 which is made from a thermosetting insulating resin or the like. In this example, this chip component 2 is an ultra thin device which is formed with a thickness less than or equal to 50 μm. This chip component 2 is mounted so that its terminal surface 2a, which is its active surface, faces away from the substrate 1 (in other words, it is bonded face-up). Either an electrically conductive adhesive material or an insulating adhesive material may be used for this adhesive layer 6. If an electrically conductive adhesive material is utilized for the adhesive layer 6, this adhesive layer 6 may be taken advantage of for electrically connecting together the wiring pattern upon the chip mounting region and the electrodes which are provided upon the rear surface of the chip component 2. A DAF (die attach film) may be used as an insulating adhesive material. Furthermore, for the adhesive layer 6, it is possible to utilize an anisotropic electrically conductive paste (ACP) or an anisotropic electrically conductive film (ACF), in which electrically conductive particles are dispersed within an insulating matrix.

As shown in FIG. 2, the connection lines 11 which are connected to the substrate electrodes 4A are formed along the surface of the sloping member 15. In other words, upon the side aspect portion of the chip component 2, the sloping member 15 is formed so as to have a sloping face portion 15a which extends outwards from the terminal surface 2a of the chip component 2, to arrive upon the mounting surface 1a of the substrate 1 (i.e., at the substrate electrodes 4A). The connection lines 11 are formed so as to join together the device electrodes 7 and the substrate electrodes 4A along the surface of the sloping face portion 15a of this sloping member 15. The sloping member 15 serves the function of mitigating the step between the terminal surface 2a of the chip component 2 and the mounting surface 1a of the substrate 1, and moreover also serves the function of preventing breakage or the like of the connection lines 11 which are formed using a liquid drop ejection method. In other words, with a liquid drop ejection method, it is comparatively difficult to lay down material upon a substantially vertical surface of a target body. However, by providing the sloping member 15 so as to cover over the substantially vertical surface of the target body, and by laying down the material upon the sloping face portion 15a of this sloping member 15, it is possible to form wiring using a liquid drop ejection method simply and easily, and moreover reliably.

On the other hand, as shown in FIG. 3, the connection lines 12 which are connected to the substrate electrodes 4B are formed along the surface of the sloping member 15 and the surfaces of the sloping members 16. In other words, in addition to the above described sloping member 15 which is formed upon the side aspect portion of the chip component 2, the sloping members 16 are formed to have sloping face portions 16a which extend further onward from that sloping face portion 15a of the sloping member 15. The connection lines 12 are formed so as to join together the device electrodes 7 and the substrate electrodes 4B along the surface of the sloping face portion 15a of the sloping member 15 and the surfaces of the sloping face portions 16a of the sloping members 16. In this example, the sloping face portions 16a of the sloping members 16 cover over portions of the sloping face portion 15a of the sloping member 15, and are formed so as to extend in the direction away from the chip component 2, so as to arrive upon the mounting surface 1a of the substrate 1 (i.e., at the substrate electrodes 4B thereupon). Moreover although, in this example, the sloping members 16 are formed after the sloping member 15 has been formed, the present invention is not to be considered as being limited by this constructional feature; for example, it would also be acceptable for the sloping member 15 and the sloping members 16 to be formed at the same time.

The sloping members 15 and 16 may be, for example, formed by coating a polyimide resin, a modified silicone polyimide resin, an epoxy resin, a modified silicone epoxy resin, or a resin material such as benzocyclobutene (BTB) or polybenzoxazole (PBO) upon the flexible substrate 1 by using a liquid material coating means such as a dispenser or the like. Alternatively, the sloping members 15 and 16 may be formed by a dry film fixed upon the substrate 1. Returning to FIG. 1, the sloping member which consists of the combination of the sloping member 15 and the sloping members 16 is formed, in plan view, in an overall comb shape. In other words, the sloping members 16 which extend from the sloping member 15 are formed so as to correspond, respectively, to those substrate electrodes 4B, among the plurality of substrate electrodes 4, which are positioned farther away from the chip component 2 (i.e., from the device electrodes 7). The extended portions which are constituted by these sloping members 16 project with respect to the sloping member 15. The comparatively short sloping face portions which are constituted by the sloping member 15 correspond to those substrate electrodes 4A which are positioned closer to the device electrodes 7 (i.e., to the chip component 2). On the other hand, the comparatively long sloping face portions which are constituted by the sloping member 15 and the sloping members 16 correspond to those substrate electrodes 4B which are positioned farther from the device electrodes 7 (i.e., from the chip component 2). In other words, the lengths of the sloping face portions of the sloping face members 15 and 16 vary according to the distance between the corresponding device electrode 7 and the corresponding substrate electrode 4, and, due to this, regions are formed in which the steps up to the substrate electrodes 4 are comparatively gentle. As a result, it is possible reliably to form the connection lines 11 and 12 to each of the plurality of substrate electrodes 4, which are arrayed in a staggered manner, by using a liquid drop ejection method.

Here since, with the electronic device package 10 of this preferred embodiment of the present invention, the plurality of substrate electrodes 4 are arrayed in a staggered manner, accordingly it is possible to provide a comparatively wide gap between each pair of neighboring substrate electrodes 4. In other words, the plurality of substrate electrodes 4 are arranged so as be subdivided into the two groups of electrodes (the substrate electrodes 4A . . . and the substrate electrodes 4B . . . ) which are interleaved alternatingly and are mutually separated from one another in the X direction. The gaps between neighboring ones of the substrate electrodes 4A (and between neighboring ones of the substrate electrodes 4B) are twice the overall array pitch P1 of the entire set of substrate electrodes 4, i.e., is 2×P1.

In this manner, with the electronic device package 10 of this preferred embodiment, it is ensured that, due to the arrangement of the substrate electrodes 4 in a staggered array, the gaps between neighboring ones of the substrate electrodes are comparatively large. Due to this, it is possible for the overall array pitch (P1) of the substrate electrodes 4 conveniently to correspond to the array pitch (P2) of the device electrodes 7. In this example, the overall array pitch (P1) of the substrate electrodes 4 is the same as the array pitch (P2) of the device electrodes 7 (for example, 40 μm). By making the array pitch of the substrate electrodes 4 to be the same as the array pitch of the device electrodes 7, it is possible to alleviate the complication of the wiring and so on, and to shorten the wiring paths, so that reduction of the size of the wiring region upon the substrate 1 may be anticipated.

This electronic device package 10 may be made in the form of a BGA (Ball Grid Array) type package or a CSP (Chip Size Package) which has external terminals, or the like. Or, this electronic device package 10 may be made as an LGA (Land Grid Array) type package, which is not provided with external terminals, but in which a portion of the wiring pattern is made as a portion for external electrical connection.

Furthermore, the chip component 2 which has been mounted upon the electronic device package 10 may be sealed with a sealing compound. If a sealing compound is employed, at least the electrical connecting portions between the device electrodes 7 and the connection lines 11 and 12, and between the substrate electrodes 4 and the connection lines 11 and 12, should be sealed. Furthermore, it would also be acceptable to employ a structure in which the entire chip component 2 was sealed with a sealing compound.

Next, a method of mounting the chip component 2 upon the above described substrate 1 will be explained with reference to FIGS. 4 to 8.

The mounting method of this example includes a mounting process (shown in FIG. 4) in which the chip component 2 is mounted upon the substrate 1, a sloping member formation process (shown in FIGS. 5 and 6) in which the sloping members 15 and 16 are formed, and a connection line formation process (shown in FIGS. 7 and 8) in which the connection lines 11 and 12 are formed by a liquid drop ejection method.

—The Mounting Process—

Figure 4:
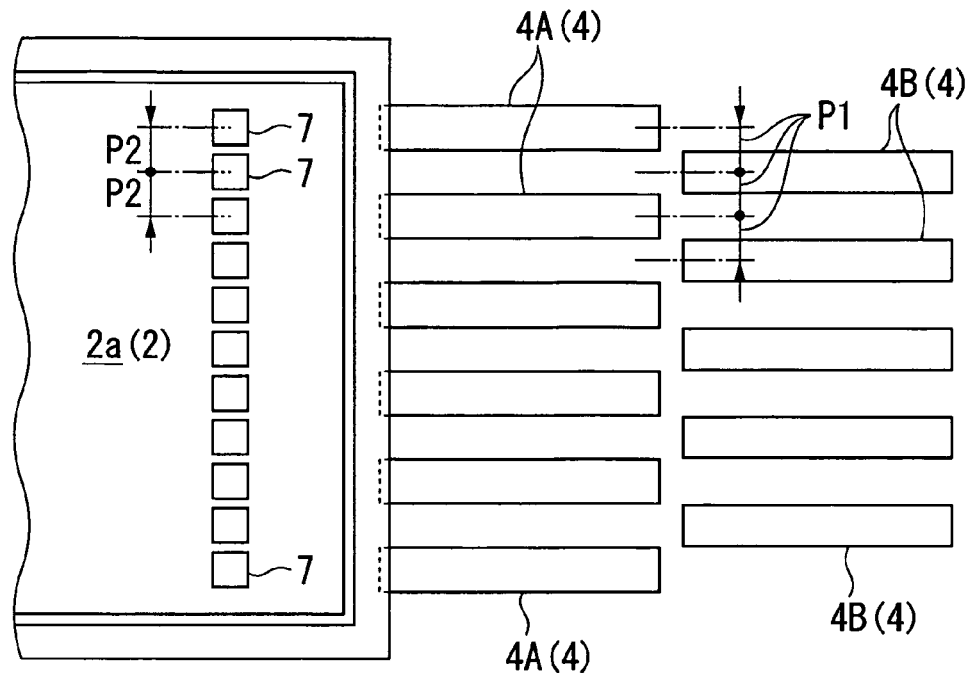
FIG. 4 is a partial plan view showing a method of manufacturing this preferred embodiment of the electronic device package according to the present invention.

First, as shown in FIG. 4, the chip component 2 is mounted upon the substrate 1, upon which a predetermined wiring pattern or an electrically conductive pattern has been formed. For example, using a device which includes a camera which is connected to a control section and a vacuum chuck (neither of which is shown in the figures), the chip component 2 may be mounted upon the substrate 1 based upon the result of observation of the position of the chip component 2 with the camera. The plurality of substrate electrodes (4A and 4B) are formed upon the substrate 1, and are arranged in a staggered array. Furthermore, the plurality of terminal electrodes (the device electrodes 7) are formed upon the terminal surface 2a of the chip component 2.

The chip component 2 is mounted upon the substrate 1 with an adhesive which has been coated upon its rear surface, or upon the substrate 1. As described above, an adhesive made of DAF (die attach film) or a resin may be used for the adhesive layer 6. It is desirable for a non-hardening resin adhesive to be used, so that it is easy to shift the chip component 2, when performing positional adjustment of the chip component 2 in its state in which it has been adhered to the substrate 1.

—The Sloping Member Formation Process—

Figure 5:
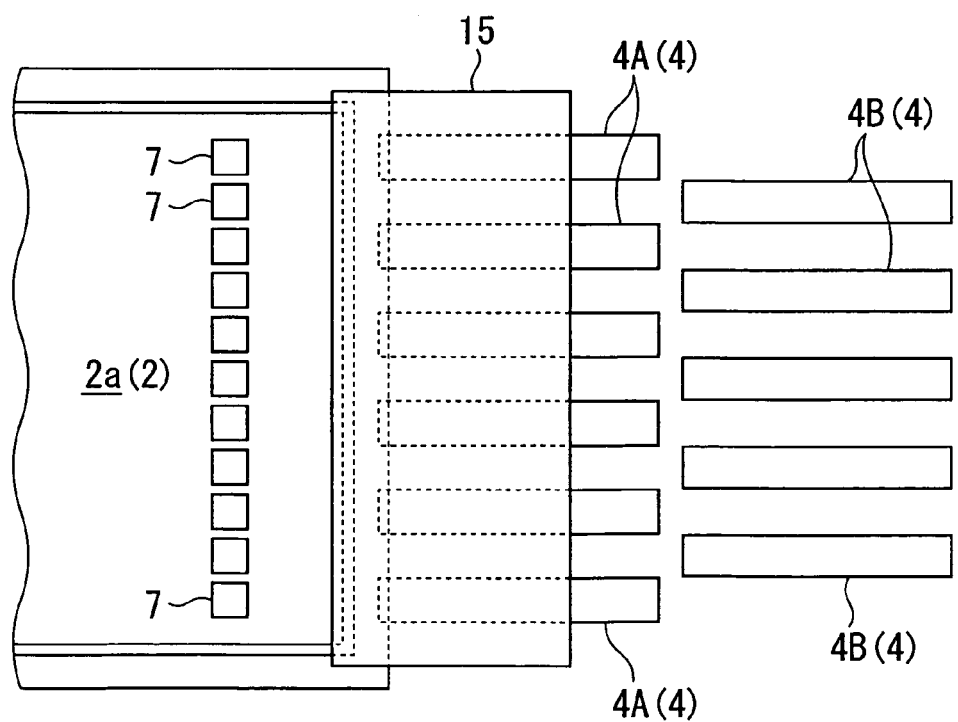
FIG. 5 is another partial plan view showing a method of manufacturing this preferred embodiment of the electronic device package according to the present invention.

Next, as shown in FIG. 5, the sloping member 15 is formed so as to contact against the side aspect portion of the chip component 2. This sloping member 15 may be made by coating, for example, a polyimide resin, a modified silicone polyimide resin, an epoxy resin, a modified silicone epoxy resin, or a resin material such as benzocyclobutene (BTB) or polybenzoxazole (PBO) upon the substrate 1, using a liquid material coating means such as a dispenser or the like. Alternatively, it may be formed by a dry film fixed upon the substrate 1. The sloping member 15 is formed so as to be thinner in the direction outwards from the side surface of the chip component 2 (refer to FIG. 2), so that a sloping surface is defined upon its upper surface. A portion of this sloping member 15 may ride up over the chip component 2.

Figure 6:
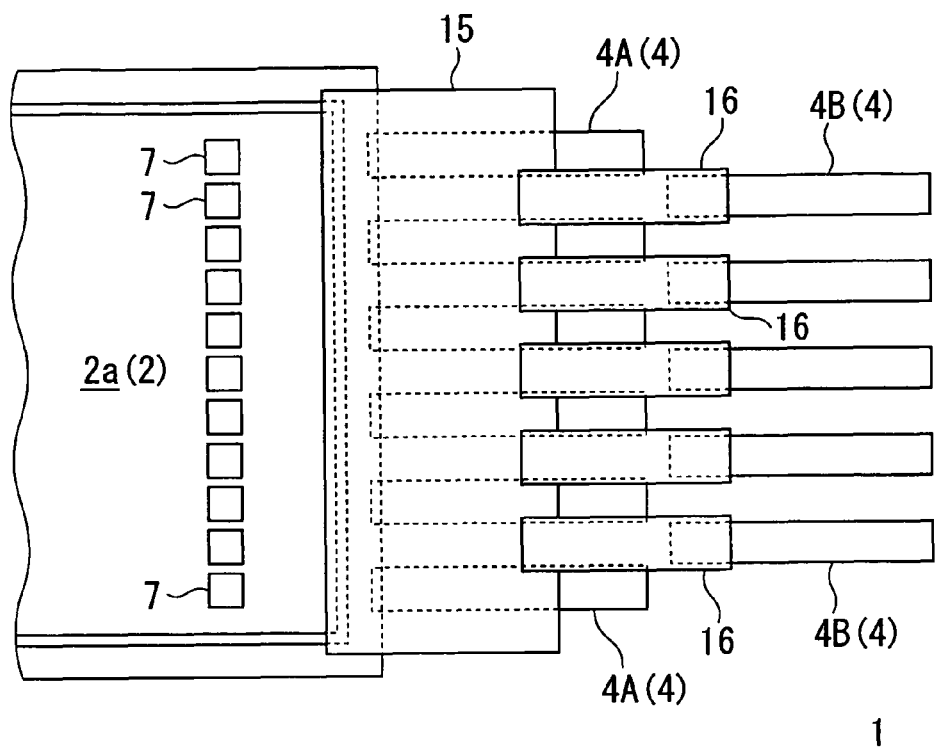
FIG. 6 is another partial plan view showing a method of manufacturing this preferred embodiment of the electronic device package according to the present invention.

Next, as shown in FIG. 6, the sloping members 16 are formed so as to cover portions of the sloping member 15. These sloping members 16 are formed so as to be embedded in the regions between the sloping member 15 and the plurality of electrodes 4B, and so as to be thinner in the direction towards the electrodes 4B from the vicinity of the edge portion of the sloping member 15 (refer to FIG. 3), so that sloping surfaces are defined upon their upper surfaces. The material which is used for these sloping members 16, and the method of forming them, may be the same as used for the sloping member 15 as described above. By doing this, the overall shape of the combination of the sloping member 15 and the sloping members 16, in plan view, comes to look like a comb.

—The Connection Line Formation Process—

Figure 7:
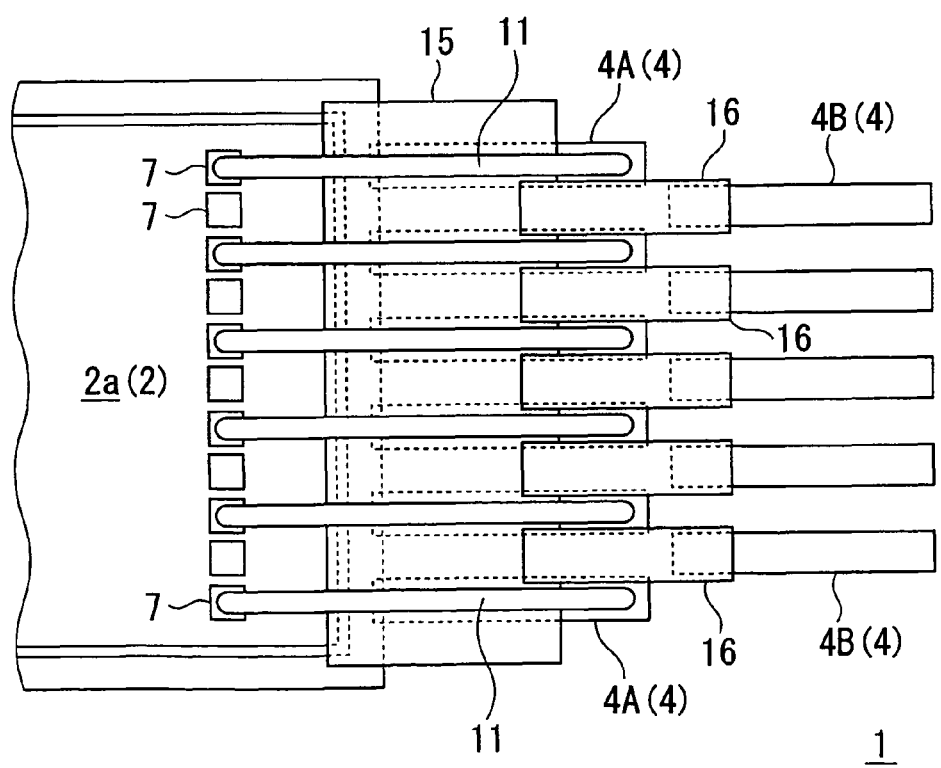
FIG. 7 is another partial plan view showing a method of manufacturing this preferred embodiment of the electronic device package according to the present invention.

Next, as shown in FIG. 7, the connection lines 11 are formed in linear shapes, so as to join together the plurality of device electrodes 7 and the plurality of substrate electrodes 4A. These connection lines 11 are formed so as to reach from each alternate one of the device electrodes 7 of the chip component 2 over the sloping surface of the sloping member 15 to the substrate electrodes 4A. In concrete terms, a liquid material which includes minute metallic particles is deposited upon linear regions between these ones of the device electrodes 7 and the substrate electrodes 4A, and thereafter metallic wiring is formed by a drying process and a firing process.

In this preferred embodiment of the present invention, when forming these connection lines 11, a liquid drop ejection method is employed, in which a liquid material in which minute electrically conductive particles are dispersed in a dispersion medium is selectively ejected by a ejection head. For this liquid drop ejection method, an ink jet method or a dispenser method or the like may be employed. In particular, an ink jet method is desirable, since it is possible to deposit the liquid material in any desired position and in any desired amount; and accordingly, in the description of this preferred embodiment, the use of an ink jet method will be assumed.

Now, a liquid drop ejection head (an ink jet head) which may appropriately be utilized for performing such ejection by an ink jet method will be explained with reference to FIG. 9.

Figure 9A:
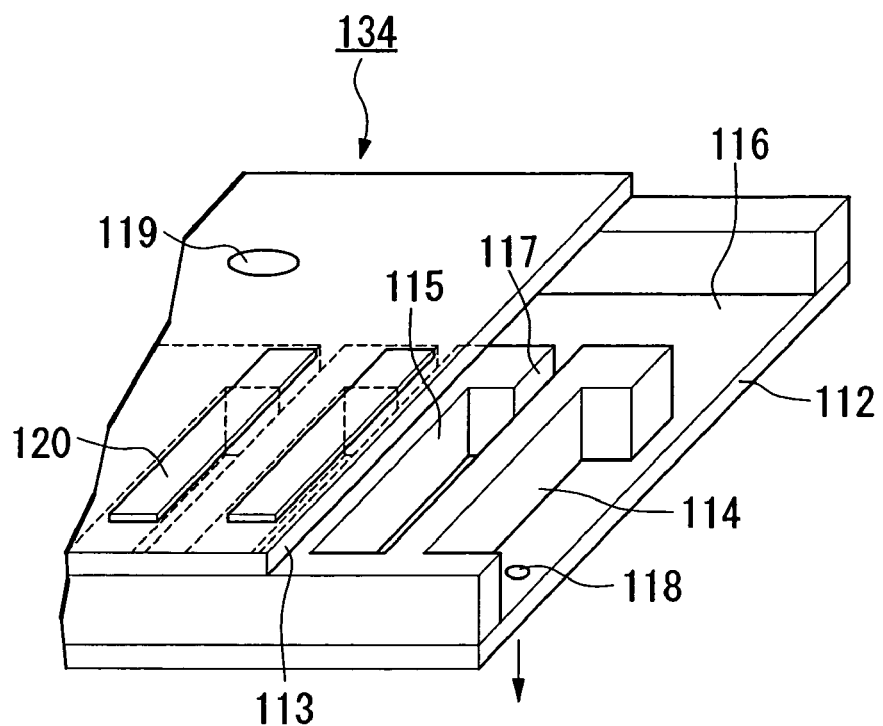
FIG. 9A is a partial sectional view of a liquid drop ejection head.

This liquid drop ejection head 134, as shown in FIG. 9A, may include, for example, a nozzle plate 112 and a vibration plate 113 which are made from stainless steel, and these two may be joined together with the interposition of a partition member 114 (a reservoir plate). A plurality of spaces 115, and a liquid reservoir 116, are defined by the partition members 114 between the nozzle plate 112 and the vibration plate 113. The interiors of these spaces 115 and the interior of the liquid reservoir 116 are filled with the liquid material. Each of the spaces 115 is communicated with the liquid reservoir 116 via a supply aperture 117. Furthermore, in the nozzle plate 112, arranged vertically and horizontally thereupon, there are formed a plurality of nozzle holes 118 for ejecting liquid material from the corresponding spaces 115. On the other hand, an aperture 119 is formed in the vibration plate 113 for supplying the liquid material into the liquid reservoir 116.

Figure 9B:
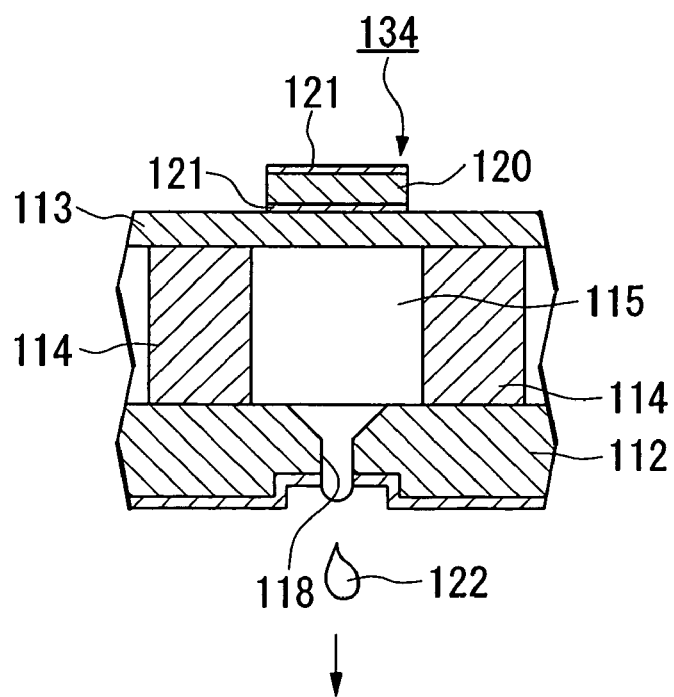
FIG. 9B is another partial sectional view of this liquid drop ejection head.

Furthermore, as shown in FIG. 9B, piezoelectric elements 120 (piezo elements) are mounted upon the outer surface of the vibration plate, i.e., upon it surface opposite to the one which faces into the spaces 115. These piezoelectric elements 120 are each positioned between a pair of electrodes 121. When electrical power is supplied to a pair of the electrodes 121, the corresponding one of the piezoelectric elements 120 flexes so as to project outwards. Correspondingly, that part of the vibration plate 113 which is joined to this piezoelectric element 120 is similarly flexed to the outside, simultaneously as one body with its piezoelectric element 120. Due to this, the volume of the corresponding one of the spaces 115 is increased. As a result, a quantity of liquid material which corresponds to the amount of volume increase of this space 115 is sucked from the liquid reservoir 116 via the corresponding supply aperture 117 into this space 115. Furthermore, when subsequently the supply of electrical power to this pair of electrodes 121 is cut off, this piezoelectric element 120 and its portion of the vibration plate 113 return to their original shapes, and the volume of this space 115 returns to its original value. As a result, the liquid material in the interior of this space 115 is subjected to an increase of pressure, and is ejected from the corresponding nozzle hole 118 towards the substrate in the form of a liquid drop 122 consisting of the liquid material.

As the liquid material which is thus ejected in drop form, there may be utilized, for example, a dispersion of minute metallic particles of gold, silver, copper, palladium, nickel or the like in a dispersion liquid. In order to enhance the dispersivity of these minute metallic particles, their surfaces may be coated using an organic material or the like. A polymer such as, for example, one which induces steric hindrance or electrostatic repulsion may be suggested as such a coating material for coating the surfaces of the minute metallic particles. Furthermore, it is desirable for the particle diameter of the minute metallic particles to be greater than or equal to 5 nm and less than or equal to 0.1 μm. If their diameter is greater than 0.1 μm, then clogging of the nozzles of the ejection head becomes easy, and it becomes difficult to perform ejection by the ink jet method. On the other hand, if the diameter of the minute metallic particles is less than 5 nm, then the volume ratio of the coating substance with respect to the minute metallic particles becomes great, and the proportion of organic material in the layer which is obtained becomes too great.

It is desirable for the dispersion liquid in which the minute metallic particles are dispersed to have a vapor pressure at room temperature of greater than or equal to 0.001 mmHg and less than or equal to 200 mmHg (i.e., greater than or equal to 0.133 Pa and less than or equal to 26,600 Pa). If this vapor pressure is greater than 200 mmHg, then after ejection the dispersion liquid evaporates rather abruptly, and it becomes difficult to form a satisfactory layer (a satisfactory wiring layer).

Furthermore, it is more desirable for this dispersion liquid to have a vapor pressure at room temperature of greater than or equal to 0.001 mmHg and less than or equal to 50 mmHg (i.e., greater than or equal to 0.133 Pa and less than or equal to 6,650 Pa). If this vapor pressure is greater than 50 mmHg, then, in the ink jet ejection method (the liquid drop ejection method), nozzle blockage due to drying while ejecting the liquid drops occurs easily, and it becomes difficult to obtain a stable ejection. On the other hand, in the case of a dispersion liquid for which the vapor pressure at room temperature is less than 0.001 mmHg, because the dispersion liquid only dries relatively slowly, it can easily remain within the layer which is formed, and accordingly it is difficult to obtain an electrically conductive layer (a wiring layer) of good quality after the subsequent heating processing.

As the dispersion liquid which is used, this is not to be considered as being particularly limited, provided that it is capable of dispersing the minute metallic particles, and does not cause clumping of the particles. For example, as this dispersion medium, apart from water, there may also be suggested an alcohol type compound such as methanol, ethanol, propanol, butanol or the like, or a hydrocarbon type compound such as n-heptane, n-octane, decane, tetra-decane, decalin, toluene, xylene, cymene, durene, indene, dipentene, tetra-hydro-naphthalene, deca-hydro-napthalene, cyclohexyl-benzene or the like, or an ether type compound such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2 dimethoxy ethane, bis (2-methoxy ethyl) ether, p-dioxane or the like, or a polar compound such as propylene carbonate, γ-butyro lactone, N-methyl 2-pyrrolidone, dimethyl formamide, dimethyl sulfoxide, cyclohexanone or the like. Among these, water, an alcohol type compound, a hydrocarbon type compound, or an ether type compound is desirable, from the point of view of dispersability of the minute particles and stability of the dispersion liquid, and from the point of view of ease of application to an ink jet method. Furthermore, as a desirable dispersion liquid, it is possible to suggest water or a hydrocarbon type compound. These dispersion liquids may be utilized either individually, or in a mixture of two or more thereof.

The dispersion density when dispersing these minute metallic particles in the dispersion liquid, in other words the density of these minute metallic particles, may be greater than or equal to 1% by mass and less than or equal to 80% by mass, and may desirably be adjusted according to the desired thickness for the resulting metallic wiring. If this density is less than 1% by mass, then, during subsequent heating, a long time is required for the firing procedure. Furthermore, if this density is greater than 80%, then it becomes easy for clumping to occur, and it is difficult to obtain metallic wiring of uniform thickness.

It is desirable for the surface tension of the liquid in which the minute metallic particles are to be dispersed to be within the range of from 0.02 N/m to 0.07 N/m. When ejecting a liquid mass using an ink jet method, if the surface tension is less than 0.02 N/m, then the liquid drops may easily be deflected during flight, since the wettability of the liquid drops with respect to the surfaces of the nozzles is increased. On the other hand, if the surface tension is greater than 0.07 N/m, then it becomes difficult to control the amount of ejection and the ejection timing, since the shapes of the meniscuses at the end of the nozzles become unstable.

It is desirable for the viscosity of the above described liquid to be greater than or equal to 1 mPa·s and less than or equal to 50 mPa·s. When ejecting ink by an ink jet method, if the viscosity is less than 1 mPa·s, then it becomes easy for the peripheral portions of the nozzles of the ejection head to become contaminated by the ink (the liquid) which is being ejected. Furthermore, if the viscosity is greater than 50 mPa·s, then the frequency of clogging of the holes in the nozzles becomes greater, and it becomes difficult to eject the liquid drops smoothly.

When the deposition of the liquid material has been completed, a drying procedure is performed with the objective of eliminating the dispersion medium which is included in the liquid material which has been deposited upon the substrate 1. This drying procedure may, for example, be performed by processing with a conventional hot plate or electric over so as to heat up the substrate 1, or by lamp annealing or the like. As far as the light source for the light which is used for such lamp annealing, this is not to be considered as being particularly limited; it is possible to use a light source such as an infrared radiation lamp, a xenon lamp, a YAG laser, an argon laser, a carbonic acid gas laser, an excimer laser such as one utilizing Xef, XeCl, XeBr, KrF, KrCl, ArF, ArCl or the like, and so on. Generally, such a light source is used with an output in the range of 10 W to 5000 W. The light source for the light which is used for lamp annealing in this preferred embodiment may, for example, be in the range of 100 W to 1000 W.

After the above described drying procedure, a firing process is performed by heating processing or irradiation processing, with the objective of enhancing the electrical conductivity of the dried layer upon the substrate 1 (i.e., of the congealed mass of minute electrically conductive particles). The dispersion medium is more reliably eliminated by this firing process. Furthermore, if an organic metallic salt is included in this dried mass, the dispersion medium may be converted into a metal by pyrolysis. Yet further, if the minute electrically conductive particles are covered with a coating substance, it is possible to perform elimination of this coating substance by the firing process.

The above described heating processing and/or irradiation processing may be performed in a normal atmosphere, or, according to requirements, may be performed in an atmosphere of inert gas such as nitrogen, argon, helium, or the like. The temperature for this heating processing and/or irradiation processing may be set appropriately, in consideration of the boiling point (the vapor pressure) of the dispersion medium, the type and the pressure of the ambient atmosphere gas, the thermal behavior of the minute particles such as their dispersivity and oxidizability and the like, the thermal and chemical decomposition characteristics of the metallic organic salt, the heat resistance temperature of the substrate, and the like.

Figure 8:
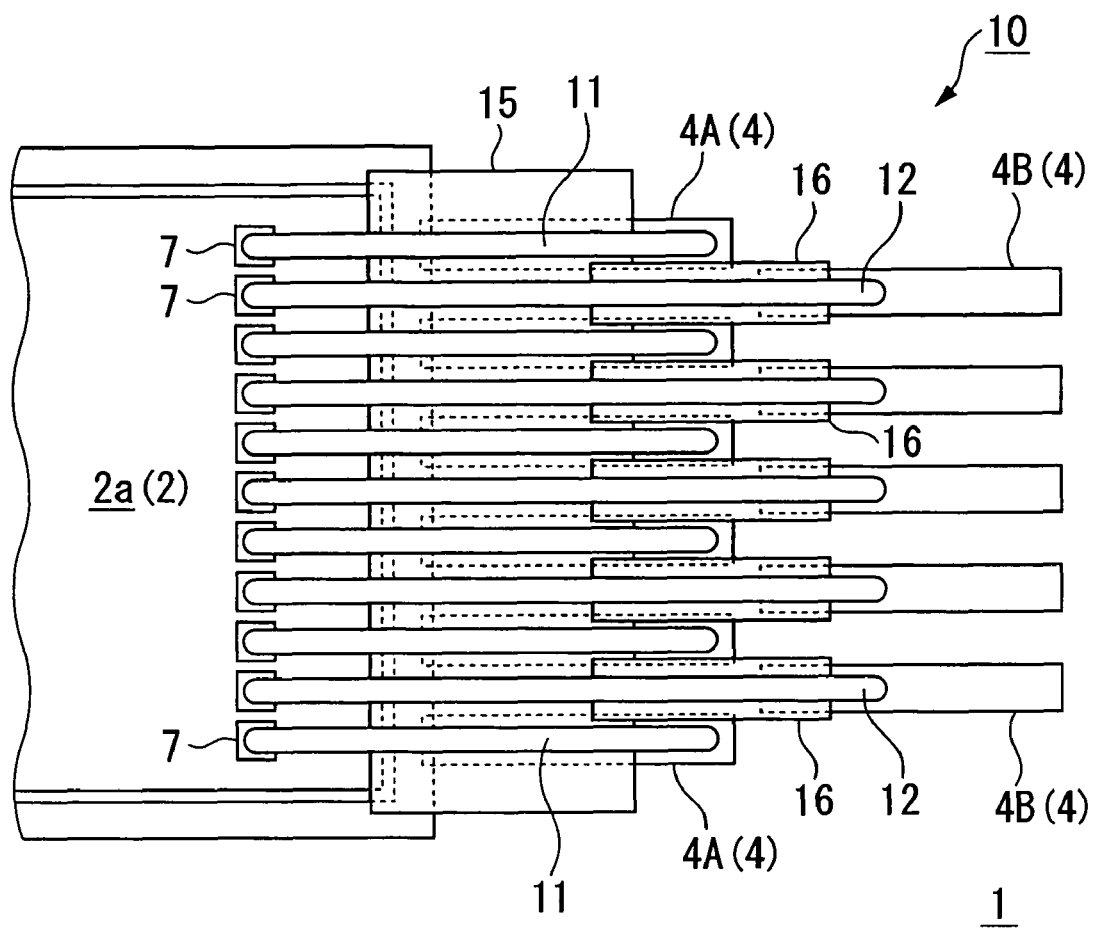
FIG. 8 is another partial plan view showing a method of manufacturing this preferred embodiment of the electronic device package according to the present invention.

Next, as shown in FIG. 8, the connection lines 12 of linear shapes are formed in linear shapes so as to join together the plurality of device electrodes 7 and the plurality of substrate electrodes 4B. These connection lines 12 are formed so as to reach from each alternate one of the device electrodes 7 of the chip over the sloping surfaces of the sloping member 15 and the sloping members 16 to the substrate electrodes 4B. The material and the method for forming the connection lines 12 are the same as for the previously described connection lines 11.

By the above described process, it is possible to mount the chip component 2 upon the substrate 1. It would also be acceptable to form a seal over the mounted chip component 2 by transfer molding or potting using a sealing compound.

Figure 10A:
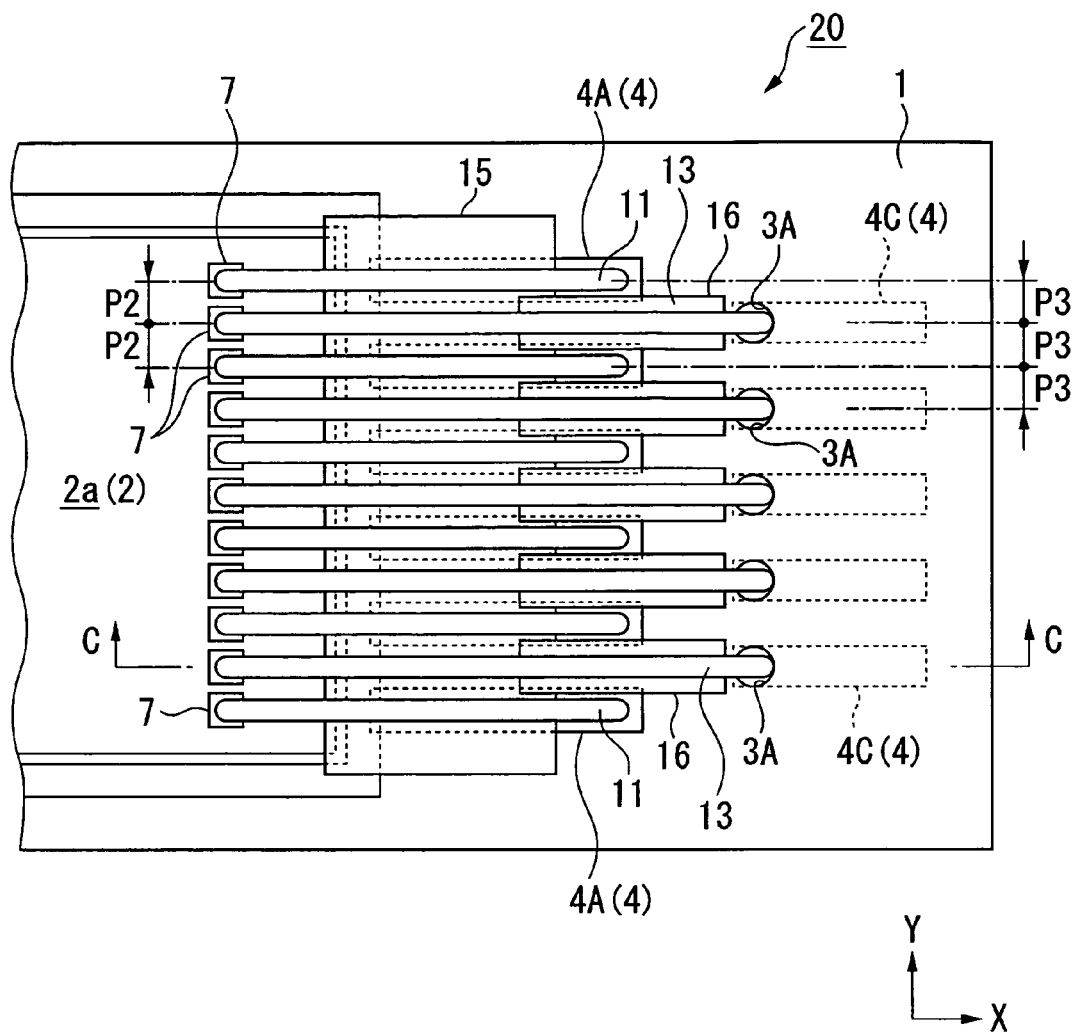
FIG. 10A is a partial plan view showing another preferred embodiment of the electronic device package according to the present invention.
Figure 10B:
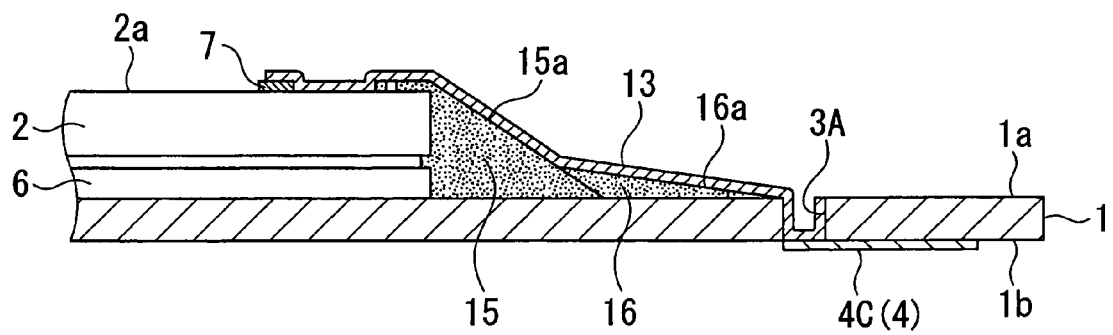
FIG. 10B is a sectional view of this other preferred embodiment of the electronic device package, taken in a plane shown by the arrows C-C in FIG. 10A.

FIG. 10A is a partial plan view showing another preferred embodiment of the electronic device package of the present invention, and FIG. 10B is a sectional view of the electronic device package of FIG. 10A taken in a plane shown by the arrows C-C in FIG. 10A. In FIGS. 10A and 10B, to elements which correspond to elements of the first preferred embodiment of the electronic device package 10 shown in FIGS. 1 to 3 and which have the same functions, the same reference symbols are appended, and the description thereof will be omitted or curtailed.

As shown in FIG. 10A, in this electronic device package 20, a chip component (an electronic device) 2 is face-up bonded upon a substrate 1, and it has a structure in which electrodes of the chip component 2 (device electrodes 7) and electrodes upon the substrate 1 (substrate electrodes 4) are electrically connected together.

In this example, the plurality of substrate electrodes 4 are arranged so as to be divided alternately between a mounting surface 1a of the substrate 1, and its rear surface 1b, which are different planes (refer to FIG. 10B). In other words, along with the plurality of substrate electrodes 4 being arranged at substantially equal intervals at a predetermined pitch (P3) along the Y direction (the transverse direction of the electrodes 4), along this array direction, they are divided alternately into one set which is laid upon the mounting surface 1a of the substrate 1, and another set which is laid upon its rear surface 1b. To put it in another manner, the plurality of substrate electrodes 4 consist of two electrode groups (one group of substrate electrodes 4A and another group of substrate electrodes 4C) which are divided between the two surfaces of the substrate 1 in an alternating manner. The group of substrate electrodes 4A and the group of substrate electrodes 4C are mutually separated from one another along the X direction, and moreover are displaced from one another by the predetermined pitch (P3) along the Y direction.

The electrodes 7 upon the chip component 2 and the electrodes 4 upon the substrate 1 are connected together via a plurality of connection lines 11 and 13. Among this plurality of connection lines 11 and 13, one end of each of the connection lines 11 is connected to one of the electrodes 7 of the chip component 2, while its other end is connected to one of the substrate electrodes 4A upon the mounting surface 1a of the substrate 1. On the other hand, one end of each of the connection lines 13 is connected to one of the electrodes 7 of the chip component 2, while its other end is connected to one of the substrate electrodes 4C upon the rear surface 1b of the substrate 1. In this preferred embodiment, these connection lines 11 and 13 are fabricated using a liquid drop ejection method.

Thus, a plurality of through holes 3A are formed through the substrate 1, for passing the connection lines 13 from the mounting surface 1a of the substrate 1 through to its rear surface 1b. The diameter of these through holes 3A may be, for example, substantially the same as the thickness of the substrate electrodes 4C. Furthermore, the substrate electrodes 4C which are disposed upon the rear surface 1b of the substrate 1 are arranged so as to block up the openings of these through holes 3A on the side of the rear surface 1b. In other words, the end portion on the side close to the chip component 2 of each of the plurality of substrate electrodes 4C on the side of the rear surface 1b covers over the opening of its through hole 3A.

As shown in FIG. 10B, the connection lines 13 which are connected to the substrate electrodes 4C are formed along the surfaces of the sloping member 15 and the sloping members 16. In other words there are formed, upon the side aspect of the chip component 2, both the sloping member 15 and also the sloping members 16, which have the sloping face portions 16a which extend from the sloping face portion 15a of the sloping member 15. The connection lines 13 are formed so as to join together the device electrodes 7 and the substrate electrodes 4C along the sloping face portion 15a of the sloping member 15 and the sloping face portions 16a of the sloping members 16, and via the through holes 3A. In this preferred embodiment, the sloping face portions 16a of the sloping members 16 cover portions of the sloping face portion 15a of the sloping member 15, and are formed so as to extend in the direction away from the chip component 2 and to arrive upon the mounting surface 1a of the substrate 1, or, in more concrete terms, at positions just before the through holes 3A.

Returning to FIG. 10B, in this preferred embodiment as well, comparatively short sloping face portions are formed by the sloping member 15 towards the substrate electrodes 4A which are in positions close to the device electrodes 7 (i.e., to the chip component 2); while on the other hand, comparatively long sloping face portions are formed by the sloping member 15 and the sloping members 16 towards the substrate electrodes 4C which are in positions far away from the device electrodes 7. In other words, the lengths of the sloping face portions of the sloping members 15 and 16 are varied, according to the distance between the device electrodes 7 and the substrate electrodes 4. Due to this, a region which has a comparatively gentle step is formed up to near each one of the substrate electrodes 4. As a result, the connection lines 11 and 13 to each of the plurality of substrate electrodes 4, which are arrayed in a staggered manner, may be reliably be formed by the liquid drop ejection method.

Since, with the electronic device package 20 of this preferred embodiment, the plurality of substrate electrodes 4 are arranged as being divided between the plurality of surfaces 1a and 1b which are not in the same plane, accordingly it is possible to leave a comparatively wide gap between each pair of neighboring substrate electrodes. In other words, the plurality of substrate electrodes 4 are arranged as being divided into the two groups of substrate electrodes (the substrate electrodes 4A and the substrate electrodes 4C) which are mutually separated from one another in the thickness direction of the substrate 1. Due to this, the gap between neighboring ones of the substrate electrodes 4A . . . and the substrate electrodes 4C . . . within each of their groups comes to be (2×P3), i.e. twice the array pitch (P3) of the substrate electrodes 4 as a whole.

In this manner, with the electronic device package 20 of this preferred embodiment, by arranging the substrate electrodes 4 alternatingly upon both sides, the gap between neighboring ones of the substrate electrodes 4 is comparatively large. Due to this, it is possible for the array pitch (P3) of the entire set of the substrate electrodes 4 to correspond to the array pitch (P2) of the device electrodes 7. In this preferred embodiment of the present invention, the array pitch (P3) of the entire set of the substrate electrodes 4 is the same as the array pitch (P2) of the device electrodes 7 (for example, 40 μm). By making the array pitch of the substrate electrodes 4 to be the same as the array pitch of the device electrodes 7, it is possible to alleviate the sinuosity of the wiring and so on, and to shorten the wiring paths, thus making the wiring region upon the substrate 1 shorter and more compact.

Thus since, with the electronic device package 20 of this preferred embodiment, the connection lines 13 are extended from the mounting surface 1a through the through holes 3A to the rear surface 1b, accordingly the wiring formation region includes the wall surfaces of the through holes 3A, which are substantially vertical surfaces. Although, during wiring formation using a liquid drop ejection method, this type of step is not desirable, in this preferred embodiment, the openings of the through holes 3A at the rear surface 1b are filled up by the substrate electrodes 4C. Due to this, by the formation material for the connection lines 13 being laid down so as to fill up the through holes 3A, it is possible to form the connection lines 13 reliably by using a liquid drop ejection method, and to avoid faults with the resultant wiring.

In other words, when laying down the material for formation of the connection lines 13 in the interiors of the through holes 3A of the substrate 1, falling through of this material is prevented, due to this material being deposited over the substrate electrodes 4C upon the side of the rear surface 1b of the substrate 1. Furthermore, by this material being accumulated in these portions, the mounting surface 1a side of the substrate 1 and the substrate electrodes 4C upon its rear surface 1b are reliably connected by the connection lines 13. At this time, the material for formation of the connection lines 13 may be deposited so as to fill up the entire interior spaces of the through holes 3A; or, alternatively, this material may be deposited upon the wall surfaces of the through holes 3A only to a degree which reliably ensures the formation of the connection lines 13.

The through holes 3A in the substrate 1 may be made, for example, by etching or beam irradiation. Since the wall surfaces of the through holes 3A made in this manner have comparatively large frictional resistance, due to a so called anchoring effect, it is comparatively easy for material to stick to them, even though their surfaces are substantially vertical.

Furthermore, by forming the through holes 3A in a slanting manner, it is possible to form the connection lines 13 more reliably, since the wall surfaces of the through holes 3A function in the same manner as do the sloping face portions of the previously described sloping members.

Figure 11A:
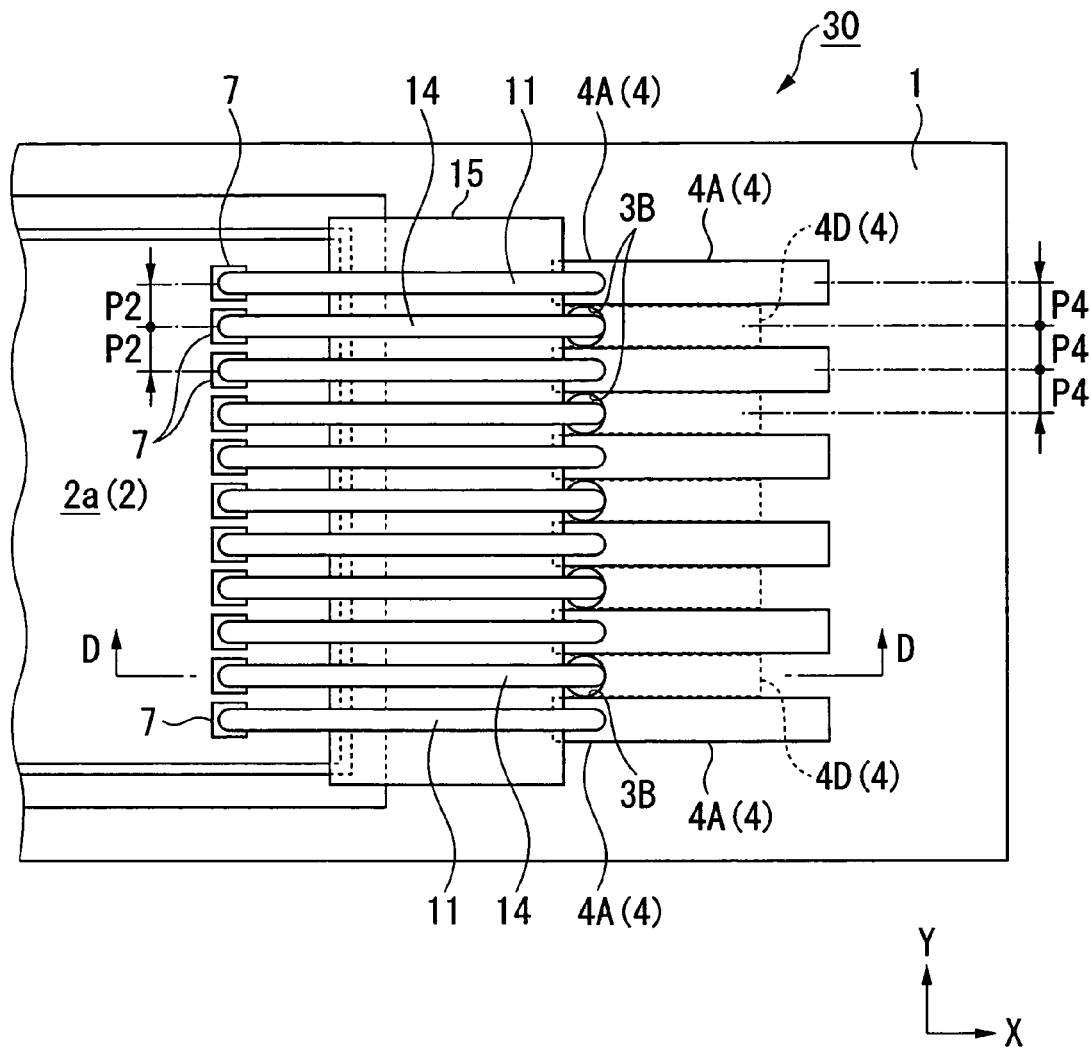
FIG. 11A is a partial plan view showing yet another preferred embodiment of the electronic device package according to the present invention.
Figure 11B:
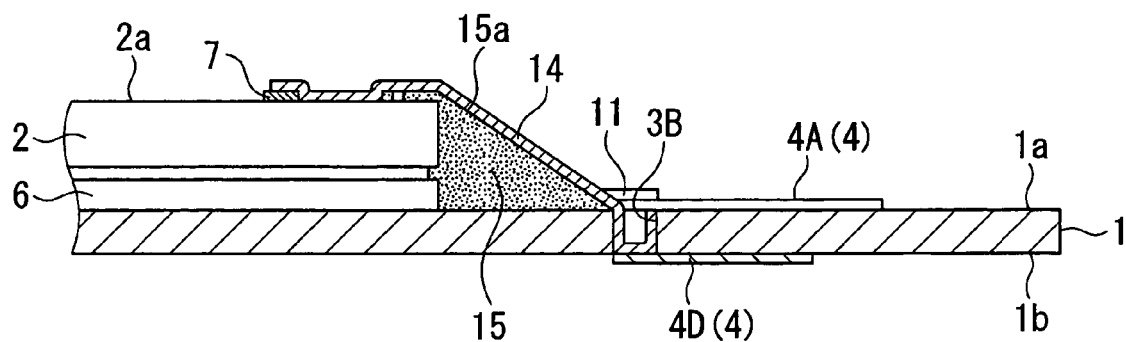
FIG. 11B is a sectional view of this yet another preferred embodiment of the electronic device package, taken in a plane shown by the arrows C-C in FIG. 11A.

FIG. 11A is a partial plan view showing a variant example of the electronic device package shown in FIGS. 10A and 10B, and FIG. 11B is a sectional view of the electronic device package of FIG. 11A taken in a plane shown by the arrows C-C in FIG. 11A. In FIGS. 11A and 11B, to elements which correspond to elements of the electronic device package 20 shown in FIGS. 10A and 10B and which have the same functions, the same reference symbols are appended, and the description thereof will be omitted or curtailed.

As shown in FIG. 11A, in this electronic device package 30, a chip component (an electronic device) 2 is face-up bonded upon a substrate 1, and it has a structure in which electrodes of the chip component 2 (device electrodes 7) and electrodes upon the substrate 1 (substrate electrodes 4) are electrically connected together.

Just as in FIGS. 10A and 10B, the plurality of substrate electrodes 4 are arranged so as to be divided alternately between a mounting surface 1a of the substrate 1, and its rear surface 1b, which are different planes (refer to FIG. 11B). In other words, along with the plurality of substrate electrodes 4 being arranged at substantially equal intervals at a predetermined pitch (P4) along the Y direction (the transverse direction of the electrodes 4), along this array direction, they are divided alternately into one set which is laid upon the mounting surface 1a of the substrate 1, and another set which is laid upon its rear surface 1b. To put it in another manner, the plurality of substrate electrodes 4 consist of two electrode groups (one group of substrate electrodes 4A and another group of substrate electrodes 4D) which are divided between the two surfaces of the substrate 1 in an alternating manner.

In this example, in the same way as in the case of the embodiment shown in FIGS. 10A and 10D, the group of substrate electrodes 4A and the group of substrate electrodes 4D are displaced from one another by the predetermined pitch (P4) along the Y direction; but they are in almost the same positional relationship along the X direction (in which they are different from the embodiment shown in FIGS. 10A and 10D).

The electrodes 7 upon the chip component 2 and the electrodes 4 upon the substrate 1 are connected together via a plurality of connection lines 11 and 14. Among this plurality of connection lines 11 and 14, one end of each of the connection lines 11 is connected to one of the electrodes 7 of the chip component 2, while its other end is connected to one of the substrate electrodes 4A upon the mounting surface 1a of the substrate 1. On the other hand, one end of each of the connection lines 14 is connected to one of the electrodes 7 of the chip component 2, while its other end is connected to one of the substrate electrodes 4D upon the rear surface 1b of the substrate 1. In this variant embodiment, these connection lines 11 and 14 are fabricated using a liquid drop ejection method.

Thus, a plurality of through holes 3B are formed through the substrate 1, for passing the connection lines 14 from the mounting surface 1a of the substrate 1 through to its rear surface 1b. The diameter of these through holes 3B may be, for example, substantially the same as the thickness of the substrate electrodes 4D. Furthermore, the substrate electrodes 4D which are disposed upon the rear surface 1b of the substrate 1 are arranged so as to block up the openings of these through holes 3B on the side of the rear surface 1b. In other words, the end portion on the side closer to the chip component 2 of each of the plurality of substrate electrodes 4D on the side of the rear surface 1b covers over the opening of its through hole 3B.

In this variant embodiment the sloping member is formed in a rectangular shape in plan view, rather than in a comb shape (so that, in this feature, it differs from the case of the example shown in FIGS. 10A and 10B). In other words, the electronic device package 30 of this variant example is made by omitting the sloping members 16 for elongation from the electronic device package 20 shown in FIGS. 10A and 10B.

As shown in FIG. 11B, the connection lines 14 which are connected to the substrate electrodes 4D are formed along the surfaces of the sloping member 15. In other words, upon the side aspect of the chip component 2, there is formed the sloping member 15. The connection lines 14 are formed so as to join together the device electrodes 7 and the substrate electrodes 4D along the surface of the sloping face portion 15a of the sloping member 15 and via the through holes 3B.

With the electronic device package 30 of this variant embodiment as well, the plurality of substrate electrodes 4 are arranged as being divided between the plurality of surfaces 1a and 1b which are not in the same plane. Due to this, it is possible to leave a comparatively wide gap between each pair of neighboring substrate electrodes. In other words, the plurality of substrate electrodes 4 are arranged as being divided into the two groups of substrate electrodes (the substrate electrodes 4A and the substrate electrodes 4D) which are mutually separated from one another in the thickness direction of the substrate 1. As a result, the gap between neighboring ones of the substrate electrodes 4A . . . and the substrate electrodes 4D . . . within each of their groups comes to be (2×P4), i.e., twice the array pitch (P4) of the substrate electrodes 4 as a whole.

In this manner, with the electronic device package 30 of this variant embodiment, by arranging the substrate electrodes 4 alternatingly upon both sides, the gap between neighboring ones of the substrate electrodes 4 is comparatively large. Due to this, it is possible for the array pitch (P4) of the entire set of the substrate electrodes 4 to correspond to the array pitch (P2) of the device electrodes 7. In this variant embodiment, the array pitch (P4) of the entire set of the substrate electrodes 4 is the same as the array pitch (P2) of the device electrodes 7 (for example, 40 μm). By making the array pitch of the substrate electrodes 4 to be the same as the array pitch of the device electrodes 7, it is possible to alleviate the sinuosity of the wiring and so on, and to shorten the wiring paths, thus making the wiring region upon the substrate 1 shorter and more compact.

Furthermore, since in this variant example the plurality of substrate electrodes 4 are positioned at almost the same positions with respect to the X direction, it is possible to anticipate shortening of the wiring region along the X direction. Along with this, in this variant embodiment, there is the beneficial aspect that it is possible to manage with a smaller and shorter sloping member, as compared with the case shown in FIGS. 10A and 10B.

—An Electronic Device—

Figure 12A:
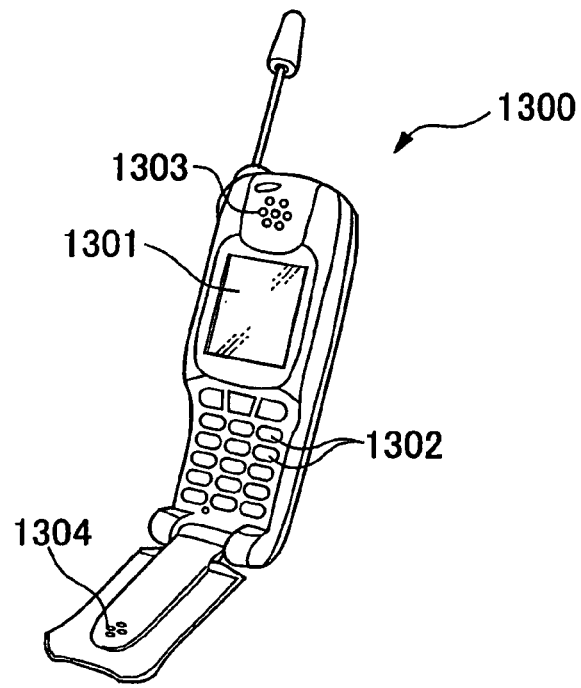
FIG. 12A is a perspective view of an electronic equipment according to a preferred embodiment of the present invention.

FIG. 12A is a perspective view showing an example of an electronic equipment according to the present invention. The portable telephone 1300 shown in this figure includes, in a chassis interior or display section 1301, an electronic device package produced using the above described method. The reference symbols 1302 in this figure denote actuation buttons, while 1303 denotes a speaker aperture and 1304 denotes a microphone aperture.

Figure 12B:
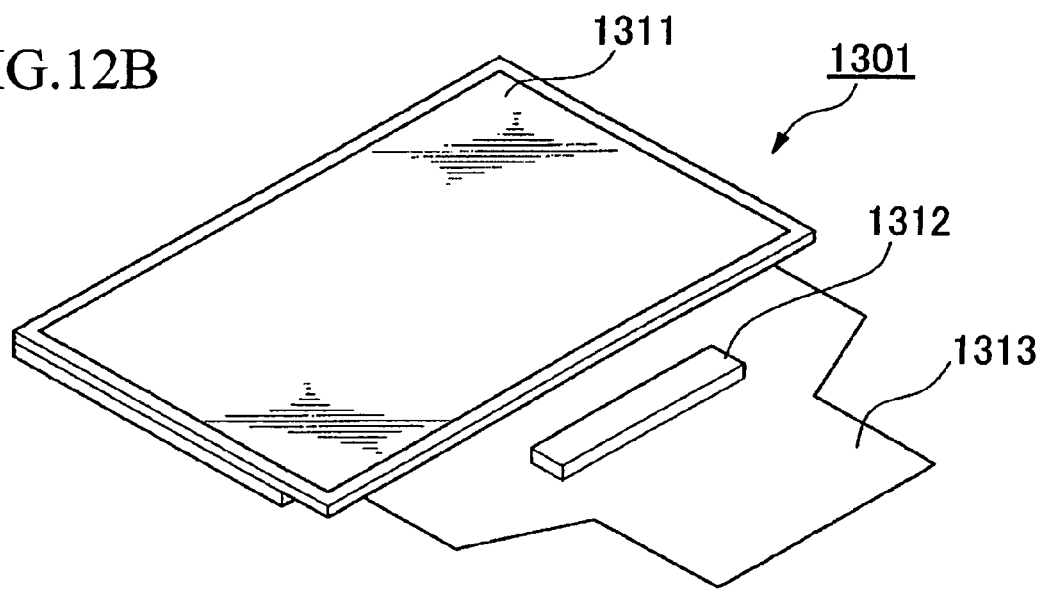
FIG. 12B is a perspective structural view of a display section of this preferred embodiment of the electronic equipment.

FIG. 12B is a perspective structural view of the display section 1301 shown in FIG. 12A. This display section 1301 has a structure in which, to one edge of a display panel 1311 which consists of a liquid crystal display device or an organic EL display device, there is connected an electronic device package 1313 upon which is mounted an electronic device 1312. With this electronic device package 1313, there may appropriately be used a substrate upon which an electronic device has been mounted using the mounting method of the present invention. It is possible to make this portable telephone 1300 thinner and more compact by mounting the electronic device upon the substrate in this ultra-thin manner.

This electronic device package according to the preferred embodiment of the present invention is not limited in its application to a portable telephone; it may also be applied to various other types of electronic equipment, such as an electronic book, a personal computer, a digital still camera, a liquid crystal television, a viewfinder type or monitor direct viewing type video tape recorder, a car navigation device, a pager, an electronic notebook, a calculator, a word processor, a work station, a television telephone, a POS terminal, a device incorporating a touch panel, or the like. It is possible to make any of these types of electronic equipment thinner and more compact by applying the electronic device package of the present invention as described above. Furthermore, it is also possible appropriately to apply the electronic device package according to the preferred embodiment of the present invention, not only to a liquid crystal device, but also as a component of an electronic equipment like an electro-optical equipemnt, such as an organic EL panel, a plasma display panel (PDP), an electric field emission display (FED) or the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. An electronic device package comprising:
   a substrate upon which an electronic device is mounted;
   a plurality of device electrodes which are formed upon the electronic device;
   a plurality of substrate electrodes which are formed upon the substrate;
   a plurality of connection lines, formed by a liquid drop ejection method, each of which electrically connects together one of the plurality of device electrodes and one of the plurality of substrate electrodes; and
   a sloping member which comprises a sloping face portion between the plurality of device electrodes and the plurality of substrate electrodes; wherein:
   a surface of the electronic device is completely covered by the sloping member, the surface being vertical to the substrate;
   the plurality of connection lines are formed directly on top of the sloping face portion; and
   the plurality of substrate electrodes are arranged in a staggered configuration; and
   an overall shape of the sloping member is a comb shape.

2. An electronic device package according to claim 1, wherein the plurality of substrate electrodes are arranged upon the substrate within substantially the same plane, or are arranged upon the substrate as being divided between a plurality of surfaces which are not coplanar.

3. An electronic device package according to claim 1, wherein the length of the sloping face portion of the sloping member is varied according to the distance between each one of the plurality of device electrodes and its corresponding one of the plurality of substrate electrodes.

4. An electronic device package comprising:
   a substrate upon which an electronic device is mounted;
   a plurality of device electrodes which are formed upon the electronic device;
   a plurality of substrate electrodes which are formed upon the substrate;
   a plurality of connection lines, formed by a liquid drop ejection method, each of which electrically connects together one of the plurality of device electrodes and one of the plurality of substrate electrodes; and
   a sloping member which comprises a sloping face portion between the plurality of device electrodes and the plurality of substrate electrodes; wherein:
   a surface of the electronic device is completely covered by the sloping member, the surface being vertical to the substrate;
   the plurality of connection lines are formed directly on top of the sloping face portion;
   the plurality of substrate electrodes are arranged upon the substrate as being divided between a plurality of surfaces which are not coplanar; and
   an overall shape of the sloping member is a comb shape.

5. An electronic device package according to claim 4, wherein the plurality of surfaces includes a mounting surface of the substrate upon which the electronic device is mounted, and its rear surface.

6. An electronic device package according to claim 5, wherein the substrate is provided with through holes for passing the connection lines through from the mounting surface to the rear surface, and the substrate electrodes upon the rear surface of the substrate are arranged so as to block up the openings of the through holes at the rear surface side.

7. An electronic equipment, comprising an electronic device package according to any one of claims 1 to 6.

* * * * *